(12) United States Patent
Motowaki

(10) Patent No.: US 11,129,317 B2
(45) Date of Patent: Sep. 21, 2021

(54) REEL HOLDER, TAPE SUPPLY DEVICE, ROBOT HAND, ROBOT, AND PART MOUNTING SYSTEM

(71) Applicant: Fanuc Corporation, Yamanashi (JP)

(72) Inventor: Yoshio Motowaki, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 35 days.

(21) Appl. No.: 16/532,048

(22) Filed: Aug. 5, 2019

(65) Prior Publication Data

US 2020/0068758 A1 Feb. 27, 2020

(30) Foreign Application Priority Data

Aug. 24, 2018 (JP) .............................. JP2018-157687

(51) Int. Cl.
| | | |
|---|---|---|
| *H05K 13/04* | (2006.01) | |
| *H05K 13/02* | (2006.01) | |
| *H05K 13/08* | (2006.01) | |
| *B65H 37/00* | (2006.01) | |

(52) U.S. Cl.
CPC ....... *H05K 13/0419* (2018.08); *B65H 37/002* (2013.01); *H05K 13/021* (2013.01); *H05K 13/0812* (2018.08)

(58) Field of Classification Search
CPC .. B65H 37/002; B65H 19/123; B65H 16/024; B65H 2555/31; B65H 2701/11332; H05K 13/0417; H05K 13/0419; H05K 13/021; H05K 13/0812; B25J 15/12; B25J 15/08; B25J 15/0616; B25J 15/0052; B25J 15/0066; B25J 15/0028
See application file for complete search history.

(56) References Cited

U.S. PATENT DOCUMENTS

| | | | | |
|---|---|---|---|---|
| 4,138,069 A | * | 2/1979 | Bonzo .................... | B65H 65/00 242/474.5 |
| 4,708,298 A | * | 11/1987 | Allard .................... | B65H 65/00 242/474.5 |
| 5,012,985 A | * | 5/1991 | Pepe .................... | B65H 67/048 242/473.5 |
| 6,585,185 B1 | * | 7/2003 | Weiss ................. | B65H 19/2223 242/527.7 |

(Continued)

FOREIGN PATENT DOCUMENTS

| | | |
|---|---|---|
| EP | 3468327 A1 | 4/2019 |
| JP | H01104552 A | 4/1989 |

(Continued)

OTHER PUBLICATIONS

Otsuka, Takako; Notice of Reasons for Refusal; Japanese Patent Application No. 2018-157687; dated Jul. 21, 2020; 4 pages.

*Primary Examiner* — Glenn F Myers
(74) *Attorney, Agent, or Firm* — Shackelford, Bowen, McKinley & Norton, LLP

(57) ABSTRACT

A reel holder includes: a plate-shaped rotating plate; multiple reel support portions evenly arranged in a circumferential direction about the center of the rotating plate, and supporting the tape reels such that each of the tape reels is rotatable about the center thereof; and a rotating plate support portion supporting the rotating plate such that the rotating plate is rotatable about the center of the rotating plate.

10 Claims, 9 Drawing Sheets

(56) References Cited

U.S. PATENT DOCUMENTS

| | | | |
|---|---|---|---|
| 10,603,800 B1* | 3/2020 | Claretti | B25J 15/0061 |
| 10,800,045 B1* | 10/2020 | Jonas | B25J 9/1694 |
| 2015/0059171 A1* | 3/2015 | Kanai | H05K 13/0417 |
| | | | 29/832 |
| 2016/0311117 A1* | 10/2016 | Nagatsuka | B25J 15/10 |
| 2017/0142873 A1* | 5/2017 | Ohashi | H05K 13/02 |
| 2017/0354070 A1 | 12/2017 | Kobayashi et al. | |

FOREIGN PATENT DOCUMENTS

| | | |
|---|---|---|
| JP | H02165696 A | 6/1990 |
| JP | H05299887 A | 11/1993 |
| JP | H10084198 A | 3/1998 |
| JP | 2015053309 A | 3/2015 |
| WO | WO-2017109891 A1 | 6/2017 |
| WO | WO-2017208287 A1 | 12/2017 |

* cited by examiner

US 11,129,317 B2

REEL HOLDER, TAPE SUPPLY DEVICE, ROBOT HAND, ROBOT, AND PART MOUNTING SYSTEM

CROSS-REFERENCE TO RELATED APPLICATIONS

This application claims the benefit of Japanese Patent Application No. 2018-157687, the content of which is incorporated herein by reference.

TECHNICAL FIELD

The present invention relates to a reel holder, a tape supply device, a robot hand, a robot, and a part mounting system.

BACKGROUND ART

Heretofore, a tape supply device that conveys a tape from a tape reel to a part mounting device has been known (see PTLs 1 to 5, for example). An electronic part such as a semiconductor chip is held at regular intervals on the tape. The tape supply device holds two tape reels arranged on upper and lower sides or on front and rear sides. In order to supply the tape to the part mounting device without interruption, the tape supply device is configured such that the upper or rear second tape reel starts supply of the tape immediately after the tape of the lower or front first tape reel comes to an end.

To enable such continuous supply of the tape, the tape reels are replaced and positions thereof are switched once tape supply by the second tape reel is started. Specifically, the empty first tape reel is detached from the tape supply device, the second tape reel is moved to the front or lower empty position, and an unused third tape reel is attached to an empty position behind or above the second tape reel. Thereafter, the leading edge of the tape on the third tape reel is set to a predetermined position on the currently conveyed second tape.

CITATION LIST

Patent Literature

{PTL 1} Japanese Unexamined Patent Application, Publication No. 2-165696
{PTL 2} Japanese Unexamined Patent Application, Publication No. 1-104552
{PTL 3} Japanese Unexamined Patent Application, Publication No. 2015-053309
{PTL 4} Japanese Unexamined Patent Application, Publication No. 10-084198
{PTL 5} Japanese Unexamined Patent Application, Publication No. 5-299887

SUMMARY OF INVENTION

A first aspect of the present invention is a reel holder holding multiple tape reels each having a tape wound therearound, the reel holder including: a plate-shaped rotating plate; multiple reel support portions evenly arranged in a circumferential direction about the center of the rotating plate, and supporting the tape reels such that each of the tape reels is rotatable about the center thereof; and a rotating plate support portion supporting the rotating plate such that the rotating plate is rotatable about the center of the rotating plate.

DESCRIPTION OF EMBODIMENTS

Hereinafter, a part mounting system 100 of an embodiment of the present invention will be described with reference to the drawings.

Figure 1:
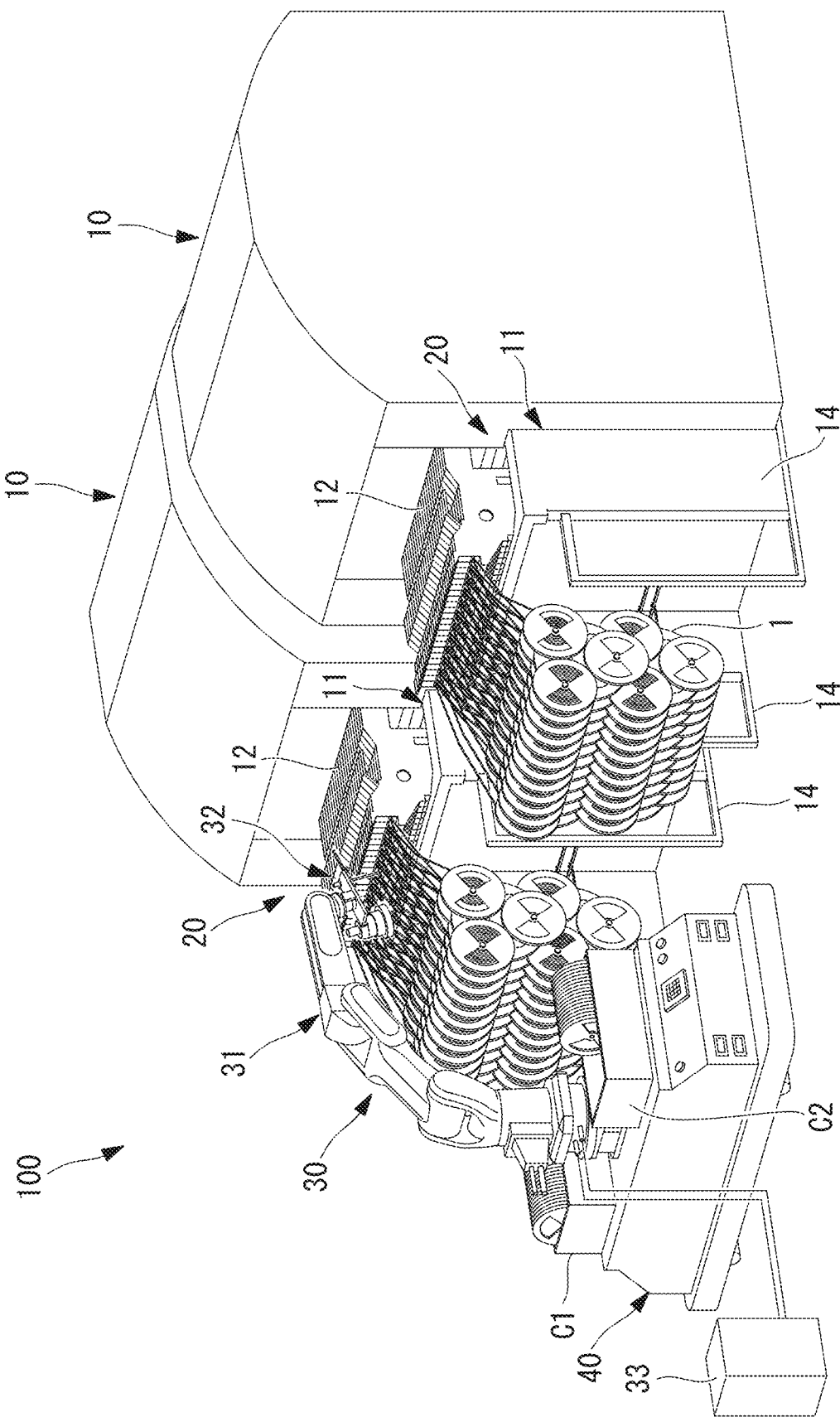
FIG. 1 is an overall configuration diagram of a part mounting system of an embodiment of the present invention.

As shown in FIG. 1, the part mounting system 100 of the embodiment includes a part mounting device 10 that mounts a part onto a substrate, a tape supply device 20 that supplies a tape T holding the part to the part mounting device 10, and a robot 30 that replaces a tape reel R of the tape supply device 20.

A part is an electronic part such as a semiconductor chip. The part is arranged at regular intervals on the long tape T. The tape reel R has a pair of side plates S facing each other with a gap interposed therebetween. The tape T is wound around a core provided in the central portion between the pair of side plates S.

The part mounting device 10 sequentially conveys the substrate to multiple mounting positions. A part held by the tape T is supplied to each mounting position from the tape supply device 20. In each mounting position, the part mounting device 10 retrieves a part from the tape T and mounts the part on a predetermined position on the substrate. Thus, multiple parts are mounted onto a single substrate.

The tape supply device 20 includes a reel holder 1 that holds multiple tape reels R, a base 11 to which the multiple reel holders 1 are attached, and a tape auto loading feeder (hereinafter referred to as ALF) 12 arranged on the base 11.

Figure 2:
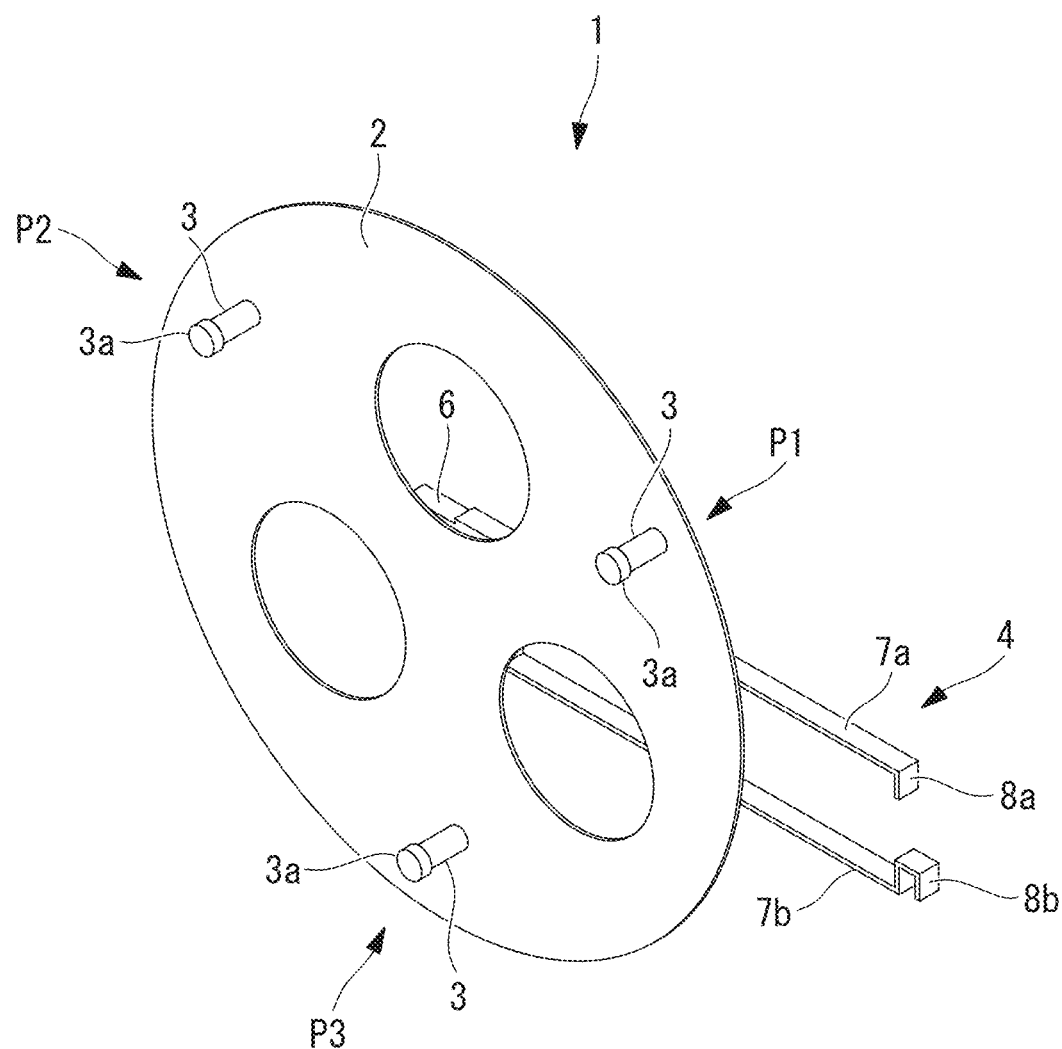
FIG. 2 is a perspective view of the front side of a reel holder of the embodiment of the present invention.
Figure 3:
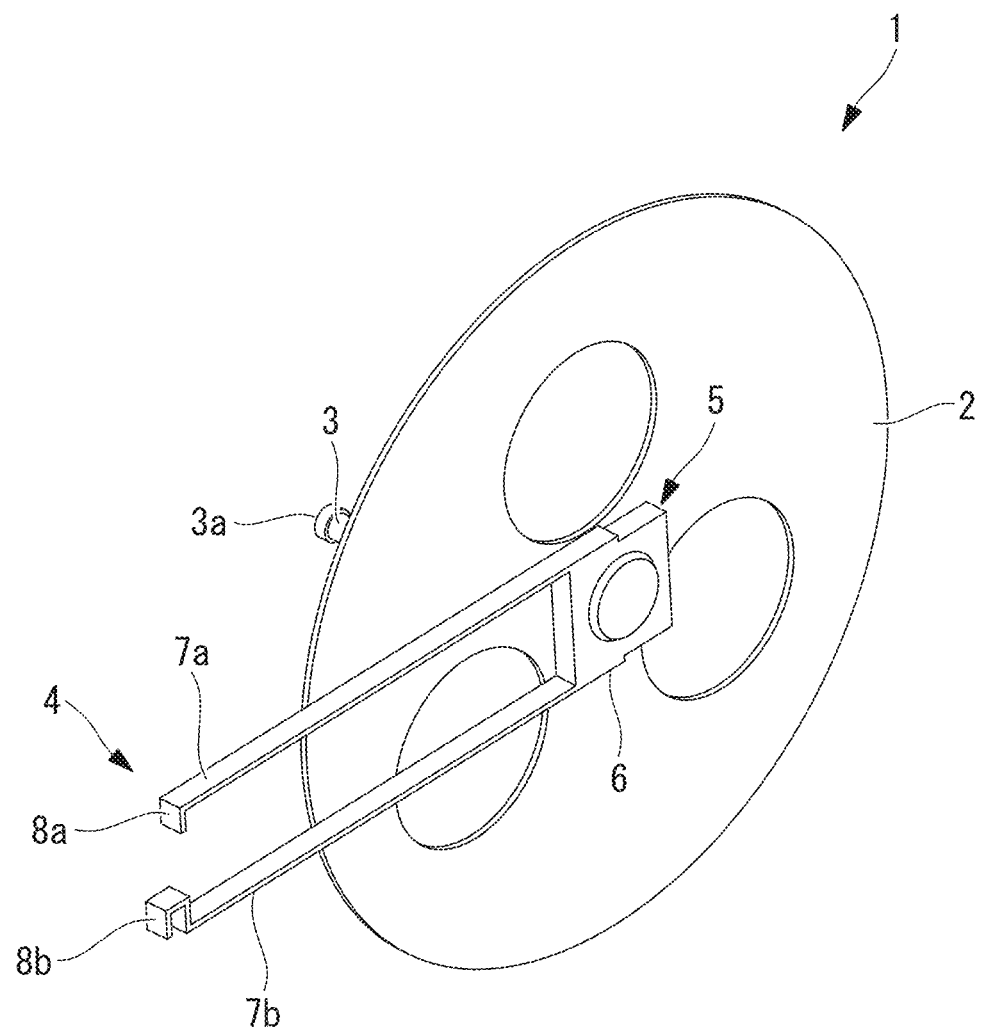
FIG. 3 is a perspective view of the rear side of the reel holder of FIG. 2.

As shown in FIGS. 2 and 3, the reel holder 1 includes a thin disk-shaped rotating plate 2, multiple reel support portions 3 fixed to the rotating plate 2, a rotating plate support portion 4 that rotatably supports the rotating plate 2, and a positioning mechanism 5 that positions the rotating plate 2.

The reel holder 1 has an up-down direction and a front-rear direction. The up-down direction and the front-rear direction are also mutually orthogonal radial directions of the rotating plate 2.

The referenced drawings show an example in which three reel support portions 3 are fixed to a single rotating plate 2, and a single reel holder 1 holds three tape reels R. Accordingly, the following description is given of a case where each reel holder 1 holds three tape reels R. Note, however, that the number of reel support portions 3 may be only two, four, or more.

Each of the three reel support portions 3 is a pin-shaped member fixed to one surface of the rotating plate 2, and protrudes from one surface of the rotating plate 2 in the thickness direction of the rotating plate 2. An attachment hole H penetrating the tape reel R in the width direction (direction in which the pair of side plates S face each other) is formed in the central portion of the tape reel R. The outer diameter of the reel support portion 3 is smaller than the inner diameter of the attachment hole H. The reel support portion 3 inserted into the attachment hole H supports the tape reel R such that the tape reel R is circumferentially rotatable about the center of the tape reel R.

Figure 4:
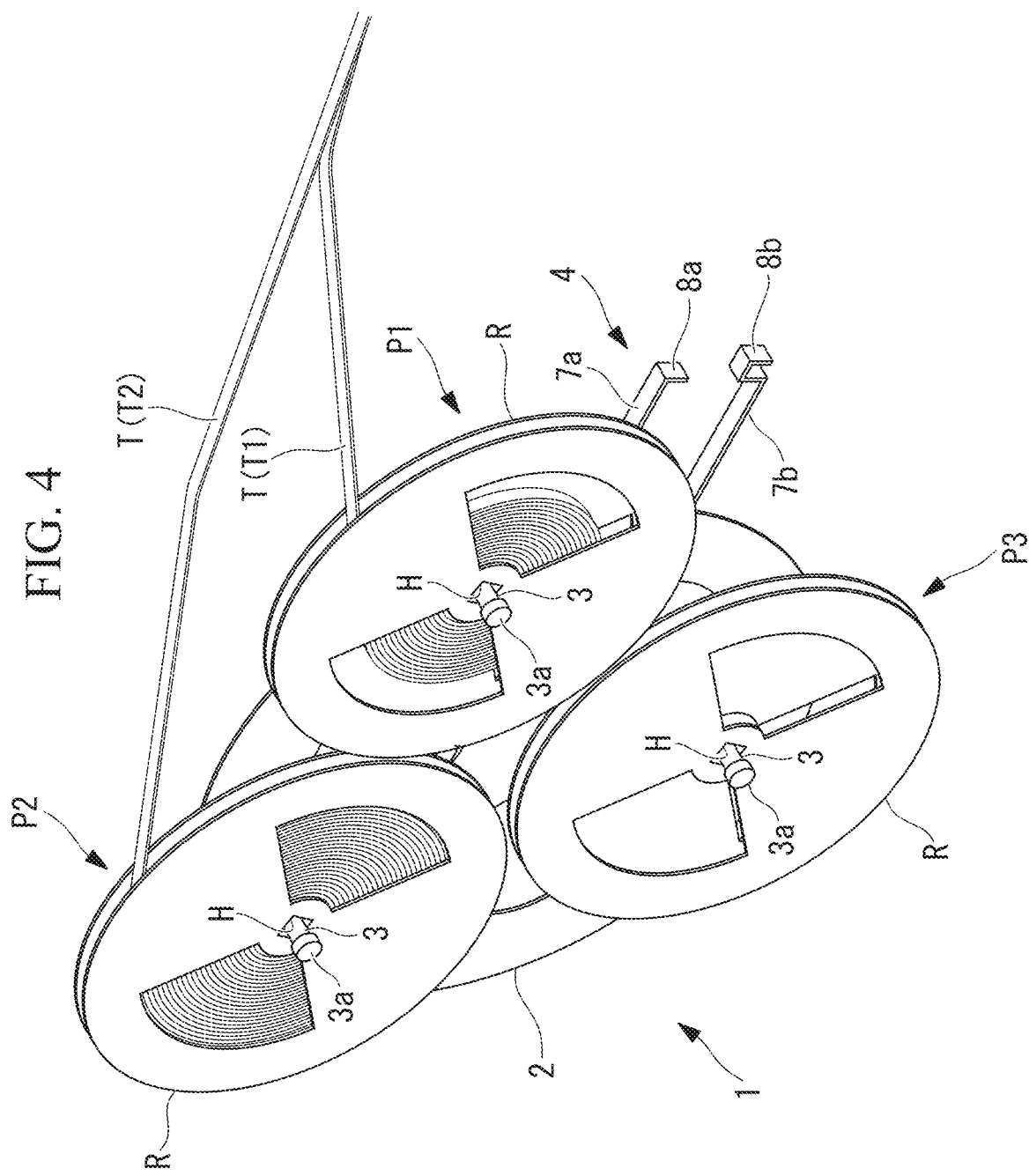
FIG. 4 is a perspective view of the reel holder of FIG. 2 in a state where three tape reels are attached.

The three reel support portions 3 are evenly arranged in the circumferential direction about the center of the rotating plate 2. FIG. 4 shows the reel holder 1 in a state where three tape reels R are attached. The three reel support portions 3 are fixed to an edge portion of the rotating plate 2. Hence, the three tape reels R are kept from interfering with one another while being supported by the three reel support portions 3.

Each reel support portion 3 may have a constant diameter over the entire length thereof. The reel support portion 3 of FIGS. 2 and 4 has a head 3a on an end opposite to the rotating plate 2. The head 3a has a larger diameter than other parts of the reel support portion 3, and protrudes farther outward in the radial direction than the other parts. When the tape reel R is supported by the reel support portion 3, an upper edge of the attachment hole H of the tape reel R is hooked on the head 3a in the horizontal direction. This prevents the tape reel R from falling off the reel support portion 3 due to vibration or the like.

The rotating plate support portion 4 has an attachment portion 6 attached to the central portion of the rotating plate 2, and a pair of bars 7a, 7b that extend parallel to the rotating plate 2 from the attachment portion 6.

The attachment portion 6 supports the rotating plate 2 such that the rotating plate 2 is circumferentially rotatable about the center of the rotating plate 2.

The pair of bars 7a, 7b are parallel to each other. The pair of bars 7a, 7b extend frontward from the attachment portion 6, and protrude farther outward in the radial direction than the rotating plate 2. Hooks 8a, 8b for attaching the bars 7a, 7b to the base 11 are provided on the tip end of the bars 7a, 7b, respectively. The hooks 8a, 8b are formed of tip end portions of the respective bars 7a, 7b bent into hook shapes, for example. By hooking the pair of hooks 8a, 8b onto a pair of horizontal bars 15a, 15b or 16a, 16b (to be described later) of the base 11, the up-down direction of the rotating plate 2 coincides with the vertical direction and the rotating plate 2 can be attached to the base 11 in such a position that the front side of the rotating plate 2 faces the base 11.

The positioning mechanism 5 is a click mechanism provided in the attachment portion 6, for example. The positioning mechanism 5 positions the reel holder 1 to three predetermined rotational positions evenly spaced in the circumferential direction about the center of the rotating plate 2, and holds the reel holder 1 in the three predetermined rotational positions. Accordingly, the reel holder 1 rotates by units of 120 degrees.

As shown in FIG. 4, rotation of the reel holder 1 causes the three tape reels R to sequentially move among a supply position P1, a stand-by position P2, and a replacement position P3. The supply position P1 and the stand-by position P2 are arranged above the center of the rotating plate 2, while the replacement position P3 is arranged below the center of the rotating plate 2. Additionally, the stand-by position P2 is arranged behind the supply position P1. The tape reel R from which the tape T is conveyed by the tape supply device 20 is arranged in the supply position P1. An unused tape reel R from which the tape T is to be conveyed next is arranged in the stand-by position P2. An empty tape reel R or an unused tape reel R from which the tape T is to be conveyed after the next tape reel R is arranged in the replacement position P3.

The base 11 has a horizontal upper frame 13 that supports the ALF 12, a pair of legs 14 that support the upper frame 13, and the two pairs of bars (holder attachment position) 15a, 15b and 16a, 16b fixed to the pair of legs 14.

The pair of legs 14 are fixed to both end portions of the upper frame 13 in the width direction.

Figure 5:
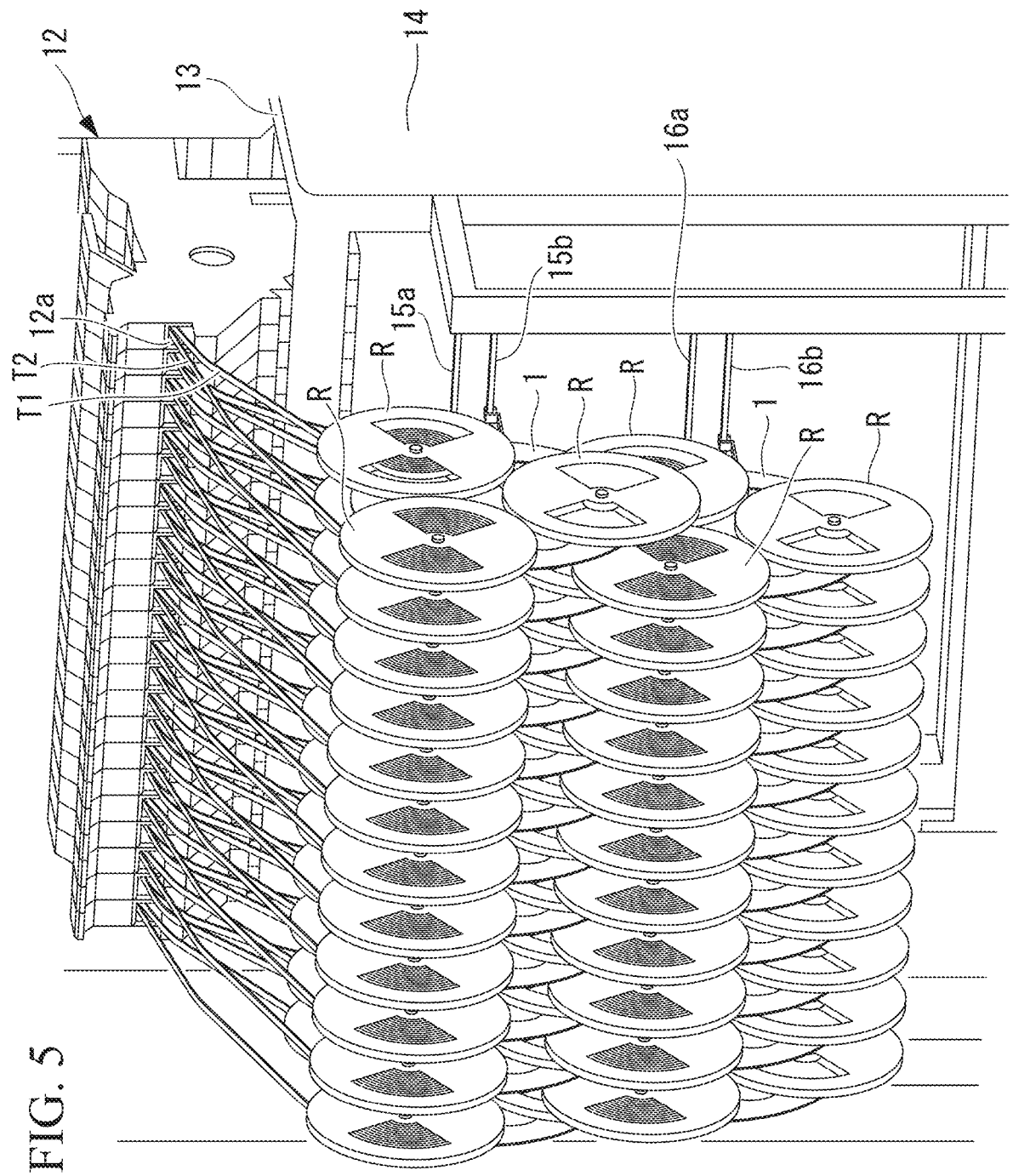
FIG. 5 is a partial enlarged view of a tape supply device.

The two pairs of bars 15a, 15b and 16a, 16b are provided on the front side of the base 11. Each of the bars 15a, 15b, 16a, 16b extends horizontally between the pair of legs 14, and both ends of each of the bars 15a, 15b, 16a, 16b are fixed to the legs 14. The bars 15a, 15b are parallel to each other, and a vertical gap between the bars 15a, 15b is substantially equivalent to a gap between the bars 7a, 7b. Similarly, the bars 16a, 16b are parallel to each other, and a vertical gap between the bars 16a, 16b is substantially equivalent to the gap between the bars 7a, 7b. FIG. 5 shows an arrangement of multiple reel holders 1 attached to the two pairs of bars 15a, 15b and 16a, 16b. The reel holders 1 of the upper bars 15a, 15b and the reel holders 1 of the lower bars 16a, 16b are arranged alternately in the horizontal direction.

The ALF 12 includes multiple parallel tape conveyance paths, and conveys the tape T along each tape conveyance path to each mounting position of the part mounting device 10. The tape conveyance path extends from an introduction port 12a that opens on the front side of the ALF 12, to the mounting position.

Since the ALF 12 is a splicingless feeder, when a currently conveyed first tape T1 comes to an end, conveyance of a second tape T2 is started automatically. Specifically, a stopper that stops the leading edge of the second tape T2 to be conveyed next until passage of the trailing edge of the currently conveyed first tape T1 is provided, in a stop position in an upstream portion of each tape conveyance path. The leading edge of the second tape T2 is inserted to the stop position from the introduction port 12a, and is set above the first tape T1. The task of setting the leading edge of the second tape T2 in the stop position is performed by the robot 30, as will be mentioned later. The stopper is fixed above the first tape T1, allows conveyance of the first tape T1, and locks movement of the leading edge of the second tape T2 in the conveyance direction. When the trailing edge of the first tape T1 passes the stop position, the leading edge of the second tape T2 moves downward by gravity, whereby the lock of the stopper is released and conveyance of the second tape T2 along the tape conveyance path is started.

The robot 30 includes a robot main body 31, a robot hand 32 attached to the robot main body 31, and a controller 33 that controls the robot main body 31.

As shown in FIG. 1, the robot main body 31 and two containers C1, C2 are placed on an automated guided vehicle (AGV) 40. One container C1 stores unused tape reels R. The other container C2 is for storing empty tape reels R collected from the reel holders 1.

The robot main body 31 is a vertically articulated six-axis robot, for example. The robot main body 31 has a robot arm having multiple joints, and the robot hand 32 is attached to a wrist flange 31a on the tip end of the robot arm. The robot main body 31 can three-dimensionally change the position and posture of the wrist flange 31a and the robot hand 32 by operation of the joints.

Figure 6:
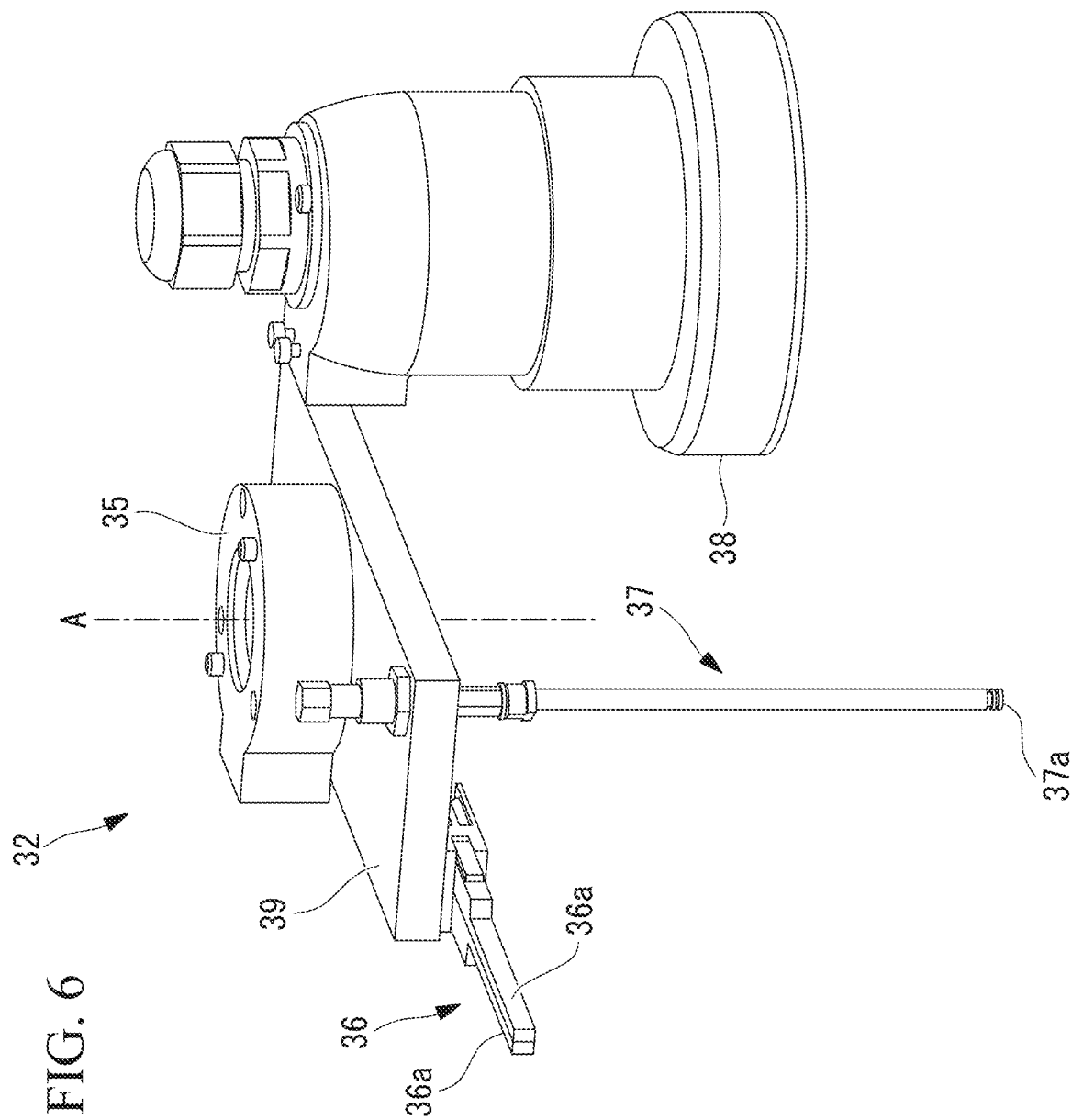
FIG. 6 is a perspective view of an overall configuration of a robot hand of the embodiment of the present invention.

As shown in FIG. 6, the robot hand 32 includes an attachable and detachable portion 35 attachable and detachable to and from the wrist flange 31a, a first gripping portion 36 for gripping the tape reel R and the rotating plate 2, a second gripping portion 37 for gripping the tape T, and a visual sensor 38. Each of the attachable and detachable portion 35, the gripping portions 36, 37, and the visual sensor 38 is fixed to a fixing member 39.

The attachable and detachable portion 35 is an automatic tool changer formed of a robot-side plate and a tool-side plate attachable and detachable to and from each other, for example. The robot-side plate is attached to the wrist flange 31a, and the tool-side plate is fixed to the fixing member 39. FIG. 6 shows only the tool-side plate.

The first gripping portion 36 is a chuck hand having a pair of finger members 36a that can be opened and closed relative to each other. The pair of finger members 36a are formed into an elongated bar shape, and are arranged parallel to each other in the opening and closing direction. The diameter of each finger member 36a is not larger than the gap between the pair of side plates S of the tape reel R. Accordingly, by inserting a tip end portion of one finger member 36a between the pair of side plates S, an edge portion of one side plate S can be nipped by the pair of finger members 36a. Moreover, an edge portion of the rotating plate 2 can be nipped with the pair of finger members 36a in a state where the reel holders 1 are densely arranged as shown in FIG. 5.

The second gripping portion 37 is a suction nozzle provided with a vacuum port 37a on the tip end thereof, and sucks the tape T onto the vacuum port 37a. The suction nozzle 37 has an elongated shape. The diameter of the suction nozzle 37 is not larger than the gap between the pair of side plates S of the tape reel R. Accordingly, by inserting a tip end portion of the suction nozzle 37 between the pair of side plates S, the leading edge of the wound tape T can be sucked by the vacuum port 37a.

In a state where the attachable and detachable portion 35 is attached to the wrist flange 31a, a central axis A of the attachable and detachable portion 35 coincides with the central axis of the wrist flange 31a.

Figure 7:
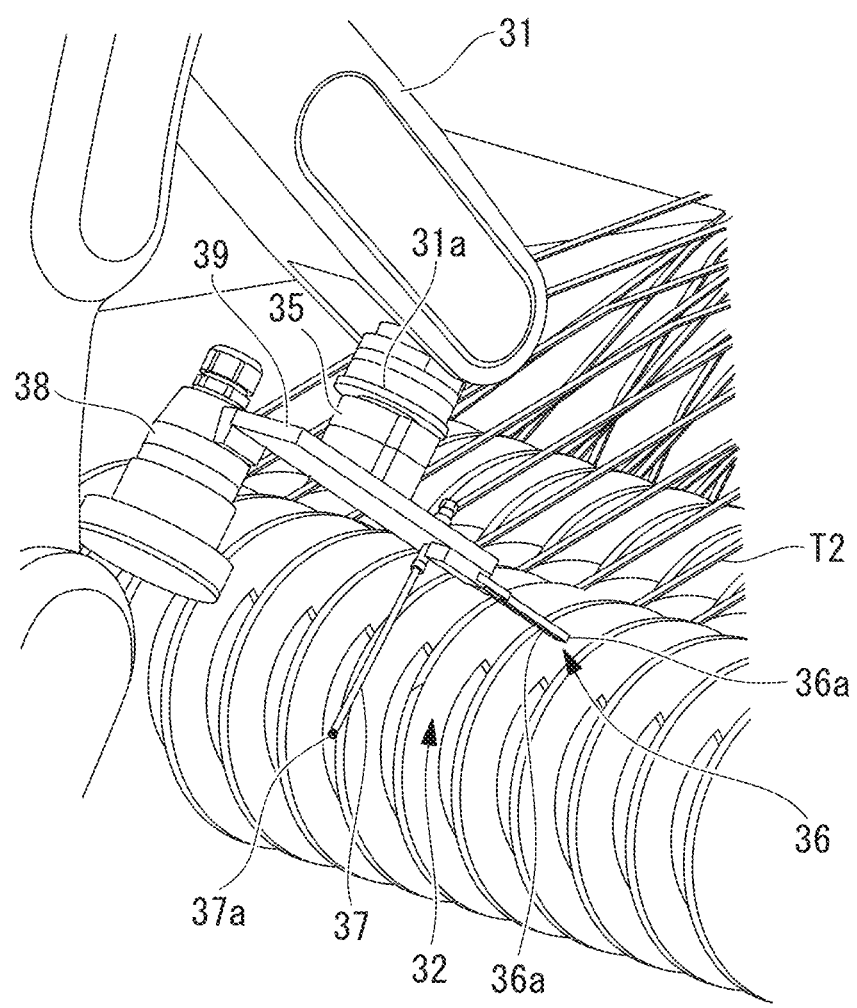
FIG. 7 is a diagram for describing an operation of nipping a tape reel by a robot hand of FIG. 6.

The first gripping portion 36 extends in a direction intersecting with the central axis A, and in the example of FIG. 6, extends in a direction perpendicular to the central axis A. Accordingly, as shown in FIG. 7, with the wrist flange 31a facing downward, the first gripping portion 36 may be brought close to the side plate S and the rotating plate 2 in the horizontal or substantially horizontal direction, to nip the front edge portion the peripheral portion of the side plate S and the rotating plate 2 with the first gripping portion 36.

Figure 8:
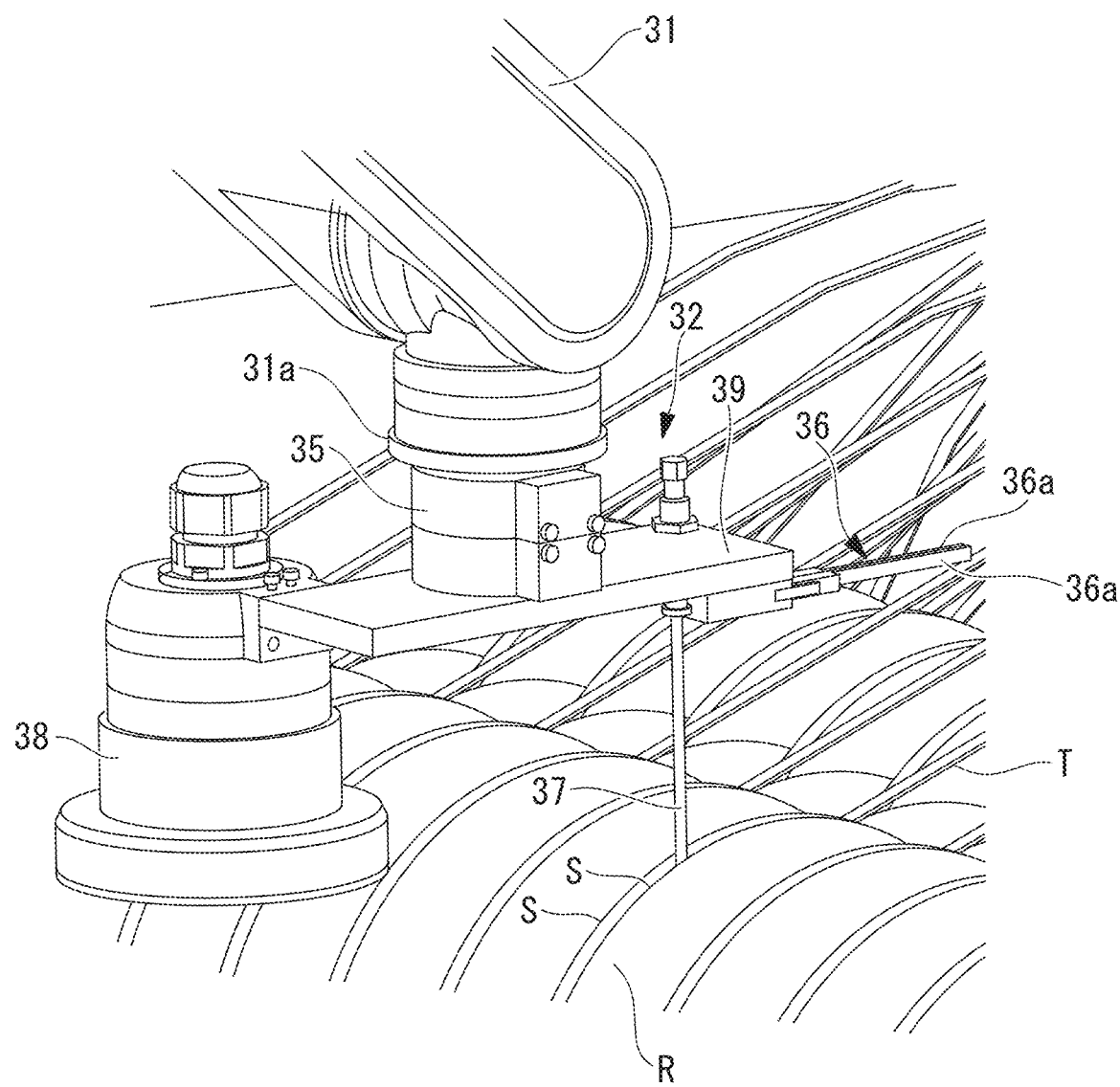
FIG. 8 is a diagram for describing an operation of sucking a tape by the robot hand of FIG. 6.

The second gripping portion 37 extends in a direction parallel to the central axis A toward the side opposite to the attachable and detachable portion 35. Accordingly, as shown in FIG. 8, with the wrist flange 31a facing downward, the second gripping portion 37 may be brought close to the tape T from above in the vertical or substantially vertical direction, to easily suck the tape T from above by the second gripping portion 37.

The visual sensor 38 is controlled by the controller 33 to pick up an image of the tape reel R, the reel holder 1, or the leading edge of the tape T which is a gripping target of the gripping portions 36, 37. The image obtained by the visual sensor 38 is transmitted to the controller 33.

The controller 33 controls the robot main body 31, the robot hand 32, and the AGV 40 to make the robot main body 31, the robot hand 32, and the AGV 40 perform the task of replacing the tape reel R.

The controller 33 also makes the visual sensor 38 obtain an image of a gripping target of the gripping portions 36, 37, detects a position of the gripping target in the image, and corrects positions of the gripping portions 36, 37 relative to the gripping target, on the basis of the detected position of the gripping target.

The controller 33 includes a processor such as a CPU, and a storage portion having a RAM, a ROM, a nonvolatile memory, and the like. The storage portion stores a reel replacement program. The processor generates a control signal for operating the robot main body 31, the robot hand 32, and the AGV 40 according to the reel replacement program, and transmits the control signal to the robot main body 31, the robot hand 32, and the AGV 40. This enables the task of replacement of the tape reel R by the robot main body 31, the robot hand 32, and the AGV 40, and correction of positions of the gripping portions 36, 37.

Next, an operation of the part mounting system 100 will be described.

While the part mounting device 10 performs the task of mounting parts onto substrates, the tape supply device 20 conveys the tapes T drawn from the tape reels R in the supply position P1 of the multiple reel holders 1, and continuously supplies the tapes T to multiple mounting positions in the part mounting device 10.

When any of the currently conveyed tape T comes close to its end, the controller 33 makes the robot main body 31, the robot hand 32, and the AGV 40 perform the task of replacing the tape reel R of the tape T.

For example, the controller 33 recognizes the position of the tape T coming close to its end on the basis of a tape-end prediction signal transmitted from the part mounting device 10. The part mounting device 10 retains information on the number of parts held by each tape reel R. The part mounting device 10 counts the number of parts supplied from each tape reel R, and when the number of supplied parts reaches a predetermined amount, transmits a tape-end prediction signal to the controller 33.

The controller 33 moves the AGV 40, and places the robot main body 31 in front of the reel holder 1 holding the tape reel R to be replaced. When the tape T of the tape reel R to be replaced in the supply position P1 comes to an end, the tape supply device 20 automatically starts to convey the tape T of the tape reel R in the stand-by position P2. After the start of conveyance of the tape T in the stand-by position P2, the controller 33 makes the robot main body 31 and the robot hand 32 switch positions of the tape reels R, set the leading edge of the tape T to be supplied next, and replace the empty tape reel R.

First, the rotating plate 2 is nipped with the first gripping portion 36, and the robot main body 31 is operated to rotate the robot hand 32 and the rotating plate 2 by 120 degrees about the center of the rotating plate 2. This moves the tape reel R holding the tape T whose conveyance is started from the stand-by position P2 to the supply position P1, moves the empty tape reel R from the supply position P1 to the replacement position P3, and moves an unused tape reel R from the replacement position P3 to the stand-by position P2.

Figure 9:
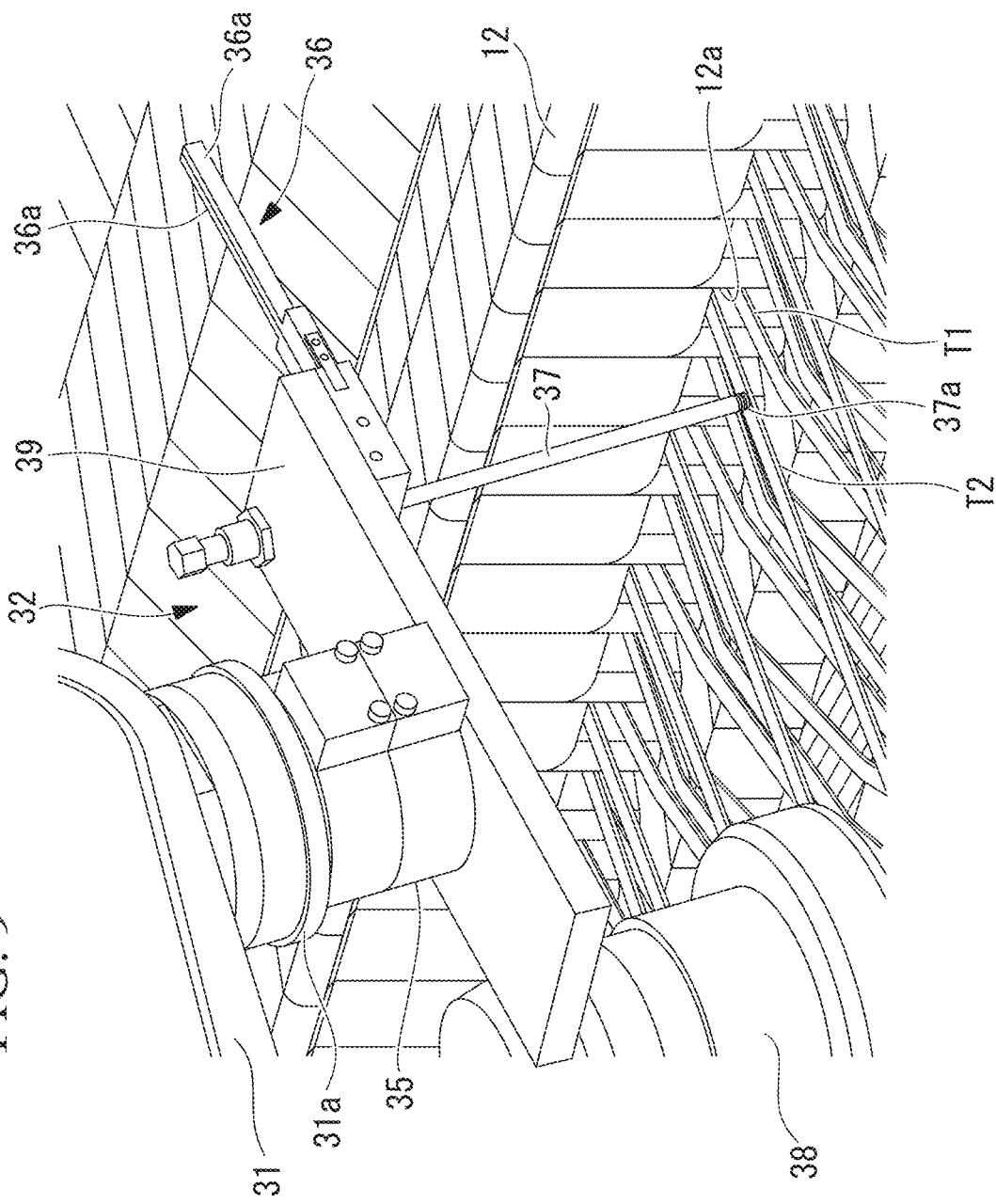
FIG. 9 is a diagram for describing an operation of setting the leading edge of a tape to an introduction port of an ALF by the robot hand of FIG. 6.

Next, as shown in FIG. 8, the leading edge of the tape T in the stand-by position P2 is sucked by the second gripping portion 37. Then, as shown in FIG. 9, the robot main body 31 is operated to insert the leading edge of the tape T sucked by the second gripping portion 37 to the stop position through the introduction port 12a of the tape supply device 20, and release the leading edge of the tape T from the second gripping portion 37.

Next, one side plate S of the empty tape reel R in the replacement position P3 is nipped with the first gripping portion 36, and the robot main body 31 is operated to horizontally move the robot hand 32 by a predetermined amount in a direction separating from the rotating plate 2. Thus, the empty tape reel R is detached from the reel holder 1. Then, the robot main body 31 and the first gripping portion 36 are operated to store the empty tape reel R in the container C2 and take out an unused tape reel R from the container C1. Then, the robot main body 31 is operated to align the attachment hole H of the unused tape reel R nipped by the first gripping portion 36 with the reel support portion 3 in the replacement position P3, and horizontally move the robot hand 32 by a predetermined amount toward the rotating plate 2. Thus, the unused tape reel R is attached to the reel support portion 3.

The empty tape reel R may be replaced before setting the leading edge of the tape T to the stop position.

In this case, according to the embodiment, the three tape reels R held on the rotating plate 2 are repeatedly moved in sequence among the three positions P1, P2, P3 by rotation of the rotating plate 2. Hence, the positions of the three tape reels R are switched by a simple operation of merely rotating the rotating plate 2 by 120 degrees. Additionally, an empty tape reel R is detached from the rotating plate 2 and an unused tape reel R is attached to the rotating plate 2 by a simple operation of merely moving the tape reel R in the horizontal direction. Moreover, since the empty tape reel R is arranged in the replacement position P3 which is easily accessible from outside, the tape reel R can be detached and attached more easily.

As described above, complicated tasks of switching of positions and replacing of tape reels R that have required the worker's manual operation in conventional techniques are simplified, so that the switching of positions and replacing of tape reels R can be performed easily even by the robot 30. This is advantageous in that the switching of positions and replacement of tape reels R can be automated, and the burden on the worker can be reduced.

While the task of replacing the tape reel R is performed by the robot 30 in the embodiment, the task may be assigned to a worker instead.

As described earlier, according to the reel holder 1 of the embodiment, the tasks of switching of positions and replacement of the tape reels R are made simpler than in conventional techniques. Hence, the worker can switch positions and replace the tape reels R easily, whereby the burden on the worker can be reduced.

From the above-described embodiment, the following invention is derived.

A first aspect of the present invention is a reel holder holding multiple tape reels each having a tape wound therearound, the reel holder including: a plate-shaped rotating plate; multiple reel support portions evenly arranged in a circumferential direction about the center of the rotating plate, and supporting the tape reels such that each of the tape reels is rotatable about the center thereof; and a rotating plate support portion supporting the rotating plate such that the rotating plate is rotatable about the center of the rotating plate.

According to the first aspect of the present invention, the rotating plate is attached to the holder attachment position of the tape supply device through the rotating plate support portion, and multiple tape reels are rotatably supported by the multiple reel support portions of the rotating plate. Then, a tape drawn from one tape reel is continuously conveyed by the tape supply device.

In this case, the rotating plate is rotatably supported by the rotating plate support portion. Hence, after the one tape reel becomes empty, the empty tape reel can be moved to an easily replaceable position merely by rotating the rotating plate. In addition, positions of multiple tape reels can be switched simultaneously merely by rotating the rotating plate. Thus, replacement and switching of positions of tape reels can be performed easily.

In the above first aspect, each of the reel support portions may be a pin-shaped member protruding from the rotating plate in a thickness direction of the rotating plate, and inserted into an attachment hole formed in a central portion of each of the tape reels.

According to this configuration, the tape reel can be supported by the reel support portion merely by aligning the attachment hole of the tape reel with the reel support portion and moving the tape reel in one direction toward the rotating plate. Additionally, the tape reel can be detached from the reel support portion merely by moving the tape reel in one direction of separating from the rotating plate.

The above first aspect may further include a positioning mechanism that holds the rotating plate positioned in multiple predetermined rotational positions evenly spaced in the circumferential direction.

According to this configuration, other than the time of switching of tape reel positions, the positioning mechanism can prevent rotation of the rotating plate and hold the tape reels in a fixed position.

In the above first aspect, the number of the reel support portions may be three or more, and the number of the rotational positions may be equal to the number of the reel support portions; and in a state where the rotating plate is arranged vertically, the multiple predetermined rotational positions may be located such that at least two of the reel support portions are arranged above the center of the rotating plate, and at least one of the reel support portions is arranged below the center of the rotating plate.

The upper two reel support portions are for a first tape reel whose tape is currently conveyed, and a second tape reel whose tape is to be conveyed next. The lower one reel support portion is for an empty tape reel or a third tape reel whose tape is to be conveyed after the second tape reel. Such an arrangement facilitates setting of the leading edge of the tape to be conveyed next, and replacement of an empty tape reel.

A second aspect of the present invention is a tape supply device including the reel holder described in any one of the above configurations.

A third aspect of the present invention is a robot hand for the reel holder described in any one of the above configurations, the robot hand including: a first gripping portion that grips the tape reel and the rotating plate; and a second gripping portion that grips the tape, in which: the first gripping portion has a pair of elongated finger members openable and closable relative to each other; and the second gripping portion has an elongated suction nozzle provided with a vacuum port on the tip end thereof.

The tape reel has a pair of side plates facing each other, and a tape is wound around a core between the pair of side plates. According to the third aspect of the present invention, by inserting one of the pair of elongated finger members into a gap between the pair of side plates, an edge portion of one side plate can be nipped with the pair of finger members.

Additionally, in a state where multiple reel holders are densely arranged, too, an edge portion of one rotating plate can be nipped with the pair of elongated finger members. Moreover, by inserting the elongated suction nozzle into a gap between the pair of side plates, the leading edge of the tape can be sucked by the vacuum port on the tip end of the suction nozzle.

The above third aspect may further include a visual sensor that detects positions of the tape reels, the rotating plate, and the tape.

According to this configuration, the tape reel and the rotating plate can be precisely gripped with the first gripping portion on the basis of the position of the tape reel and the rotating plate detected by the visual sensor. The leading edge of the tape can be precisely gripped with the second gripping portion on the basis of the position of the tape detected by the visual sensor.

A fourth aspect of the present invention is a robot including: a robot main body having a robot arm; the robot hand described in any one of the above configurations attached to the tip end of the robot arm; and a controller that controls the robot main body and the robot hand.

A fifth aspect of the present invention is a part mounting system including: the above tape supply device; and a part mounting device that receives supply of the tape from the tape supply device, and mounts a part held by the tape onto a substrate.

The above fifth aspect may further include the above robot.

REFERENCE SIGNS LIST 1 reel holder
2 rotating plate
3 reel support portion
4 rotating plate support portion
5 positioning mechanism
10 part mounting device
20 tape supply device
30 robot
31 robot main body
32 robot hand
33 controller
36 first gripping portion
36a finger member
37 second gripping portion, suction nozzle
37a vacuum port
38 visual sensor
100 part mounting system
R tape reel
T, T1, T2 tape
H attachment hole

The invention claimed is:

1. A reel holder holding a plurality of tape reels each having a tape wound therearound, the reel holder comprising:
a disk-shaped rotating plate;
at least three reel support portions evenly arranged in a circumferential direction about the center of the disk-shaped rotating plate and supporting the plurality of tape reels such that each of the plurality of tape reels is rotatable about the center thereof;
a rotating plate support portion including an attachment portion that is attached to the center of the disk-shaped rotating plate and supports the disk-shaped rotating plate such that the disk-shaped rotating plate is rotatable about the center of the disk-shaped rotating plate;
wherein the rotating plate support portion includes a pair of bars parallel to each other and a pair of hooks, the pair of bars extending from the attachment portion in a radial direction of the disk-shaped rotating plate to an outside of the disk-shaped rotating plate, the pair of hooks being provided on a tip end of the pair of bars respectively; and
wherein the disk-shaped rotating plate is arranged vertically by hooking the pair of hooks onto a pair of horizontal bars provided outside of the reel holder.

2. The reel holder according to claim 1, wherein each of the at least three reel support portions protrudes from a surface of the disk-shaped rotating plate in a thickness direction of the disk-shaped rotating plate and is a pin-shaped member inserted into an attachment hole formed in a central portion of each of the plurality of tape reels.

3. The reel holder according to claim 1, further comprising a positioning mechanism that holds the disk-shaped rotating plate positioned in at least three predetermined rotational positions, the at least three predetermined rotational positions being evenly spaced in the circumferential direction.

4. The reel holder according to claim 3, wherein:
a number of the at least three predetermined rotational positions is equal to a number of the reel support portions; and
the at least three predetermined rotational positions are located such that at least two of the reel support portions are arranged above the center of the disk-shaped rotating plate and at least one of the reel support portions is arranged below the center of the disk-shaped rotating plate.

5. A tape supply device comprising:
the reel holder according to claim 1; and
the pair of horizontal bars.

6. A robot hand for the reel holder according to claim 1, the robot hand comprising:
a first gripping portion that grips the plurality of tape reels and the disk-shaped rotating plate; and
a second gripping portion that grips the tape, wherein:
the first gripping portion has a pair of elongated finger members openable and closable relative to each other; and
the second gripping portion has an elongated suction nozzle provided with a vacuum port on the tip end thereof.

7. The robot hand according to claim 6 further comprising a visual sensor that detects positions of the plurality of tape reels, the disk-shaped rotating plate, and the tape.

8. A robot comprising:
a robot main body having a robot arm;
the robot hand according to claim 6 attached to the tip end of the robot arm; and
a controller that controls the robot main body and the robot hand.

9. A part mounting system comprising:
the tape supply device according to claim 5; and
a part mounting device that receives supply of the tape from the tape supply device, and mounts a part held by the tape onto a substrate.

10. A part mounting system comprising:
a tape supply device comprising a reel holder holding a plurality of tape reels each having a tape wound therearound and a pair of horizontal bars, the reel holder comprising:
a disk-shaped rotating plate;

at least three reel support portions evenly arranged in a circumferential direction about the center of the disk-shaped rotating plate, and supporting the plurality of tape reels such that each of the plurality of tape reels is rotatable about the center thereof; and
a rotating plate support portion including an attachment portion that is attached to the central of the disk-shaped rotating plate and that supports the disk-shaped rotating plate such that the disk-shaped rotating plate is rotatable about the center of the disk-shaped rotating plate;
wherein the rotating plate support portion includes a pair of bars parallel to each other and a pair of hooks, the pair of bars extending from the attachment portion in a radial direction of the disk-shaped rotating plate to an outside of the disk-shaped rotating plate, the pair of hooks being provided on a tip end of the pair of bars respectively;
wherein the disk-shaped rotating plate is arranged vertically by hooking the pair of hooks onto the pair of horizontal bars;
a part mounting device that receives supply of the tape from the tape supply device and mounts a part held by the tape onto a substrate; and
the robot according to claim 8.

\* \* \* \* \*